(12) United States Patent
Wang

(10) Patent No.: US 8,404,555 B2
(45) Date of Patent: Mar. 26, 2013

(54) FABRICATING METHOD OF SEMICONDUCTOR DEVICE

(75) Inventor: Charles C. Wang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 226 days.

(21) Appl. No.: 12/853,313

(22) Filed: Aug. 10, 2010

(65) Prior Publication Data

US 2012/0038052 A1 Feb. 16, 2012

(51) Int. Cl.
*H01L 21/8242* (2006.01)
(52) U.S. Cl. .. 438/396; 438/253; 257/306; 257/E21.648
(58) Field of Classification Search ............... 438/253, 438/396; 257/306, E21.648
See application file for complete search history.

(56) References Cited

U.S. PATENT DOCUMENTS

| 7,067,385 | B2 | 6/2006 | Manning | |
|---|---|---|---|---|
| 7,727,837 | B2* | 6/2010 | Gruening-von Schwerin et al. | 438/253 |
| 8,134,195 | B2* | 3/2012 | Lee et al. | 257/304 |
| 2005/0158949 | A1* | 7/2005 | Manning | 438/253 |
| 2006/0134854 | A1* | 6/2006 | Park et al. | 438/239 |
| 2010/0155802 | A1* | 6/2010 | Ohuchi | 257/306 |

* cited by examiner

*Primary Examiner* — Steven J Fulk
(74) *Attorney, Agent, or Firm* — Jianq Chyun IP Office

(57) ABSTRACT

A fabricating method of a semiconductor device is provided. Pillars are formed on a substrate. A first oxide layer is continuously formed on upper surfaces and side walls of the pillars by non-conformal liner atomic layer deposition. The first oxide layer continuously covers the pillars and has at least one first opening. The first oxide layer is partially removed to expose the upper surfaces of the pillars, and a first supporting element is formed on the side wall of each of the pillars. The first supporting element is located at a first height on the side wall of the corresponding pillar and surrounds the periphery of the corresponding pillar. The first supporting elements around two adjacent pillars are connected and the first supporting elements around two opposite pillars do not mutually come into contact and have a second opening therebetween.

14 Claims, 10 Drawing Sheets

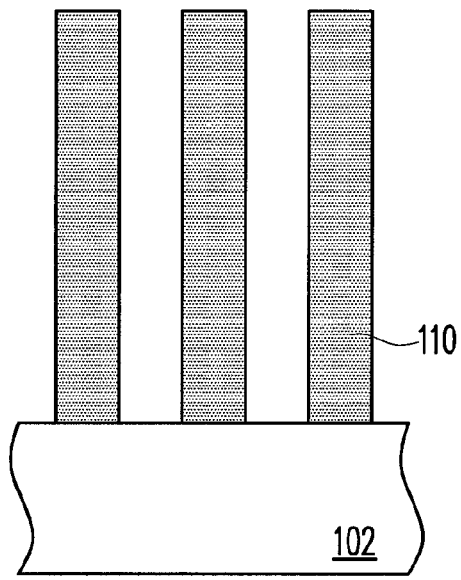
FIG. 2A-I
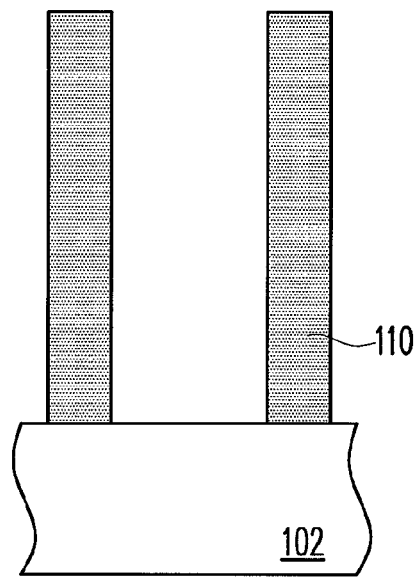
FIG. 2A-II
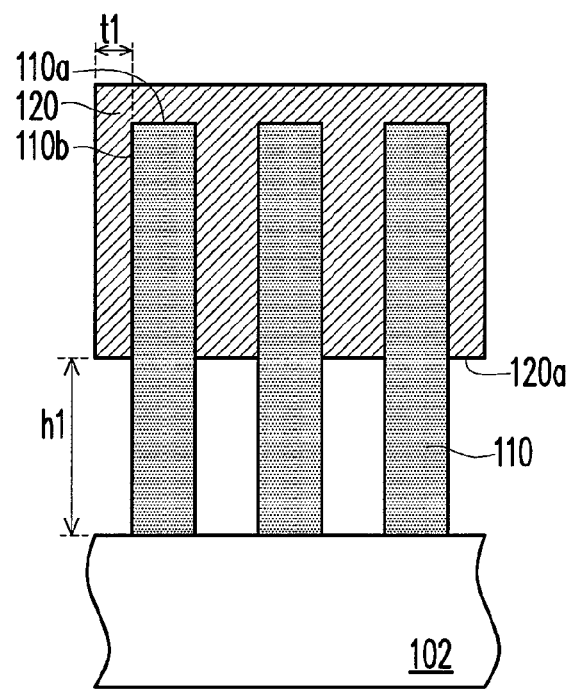
FIG. 2B-I
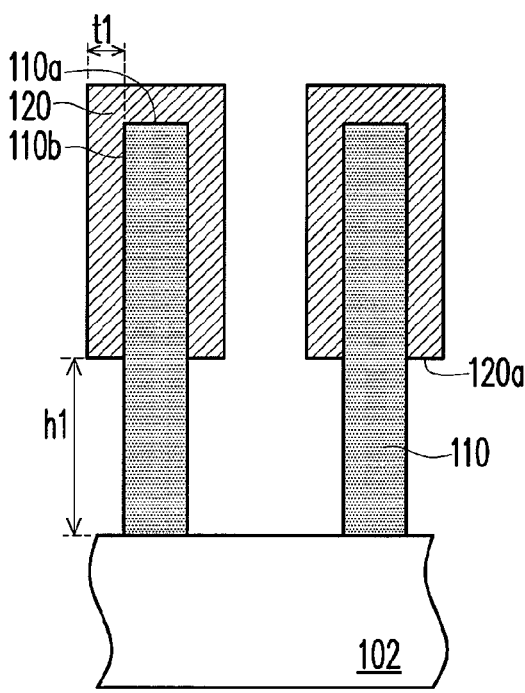
FIG. 2B-II

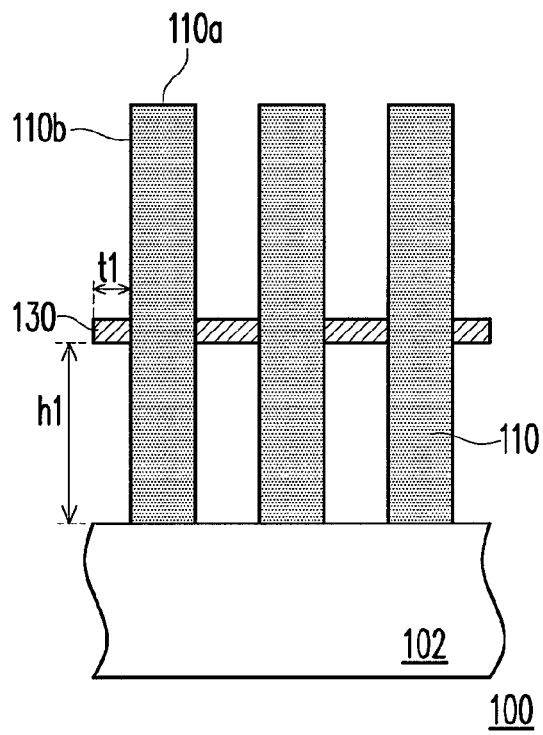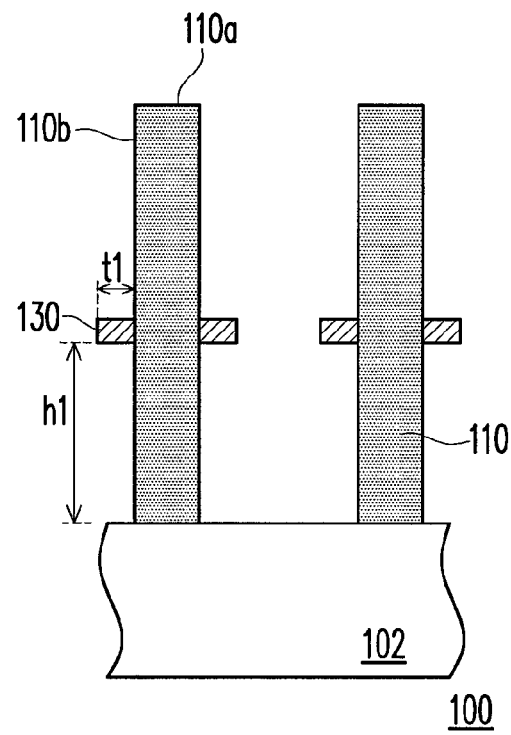
FIG. 2C-I    FIG. 2C-II

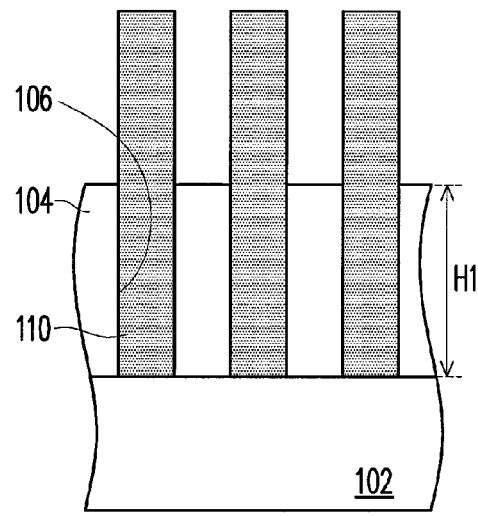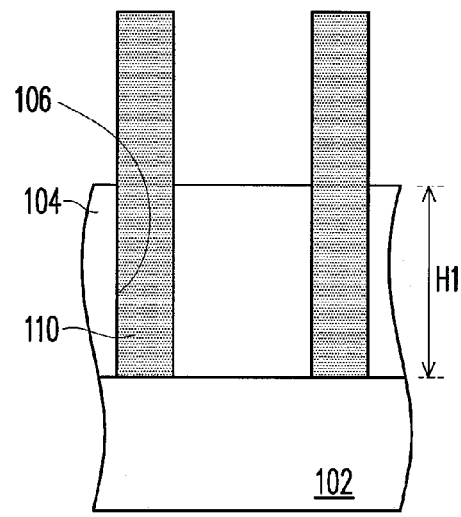
FIG. 4A-I  FIG. 4A-II
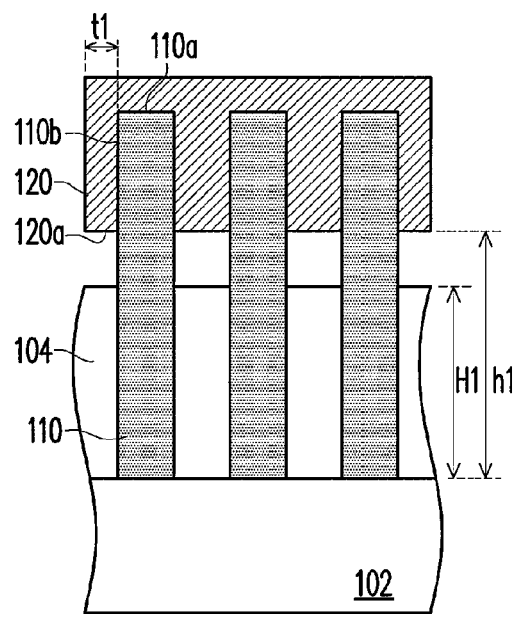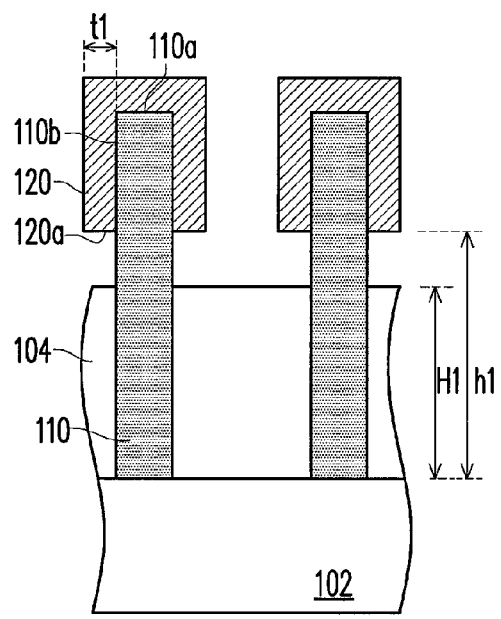
FIG. 4B-I  FIG. 4B-II

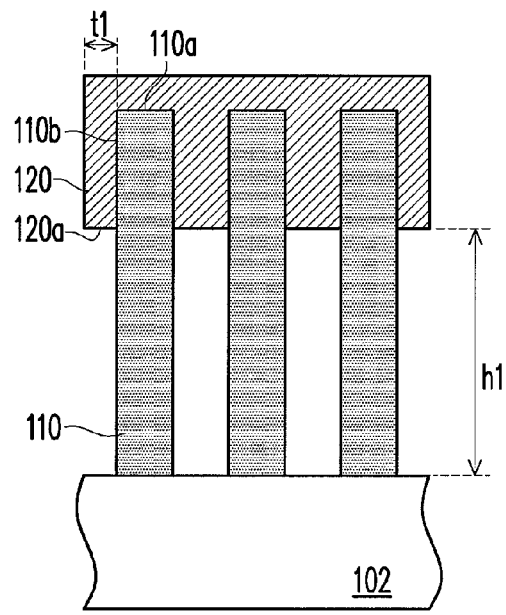
FIG. 4C-I
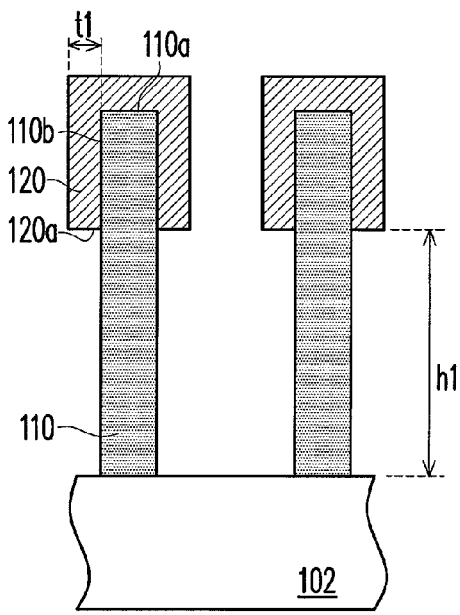
FIG. 4C-II
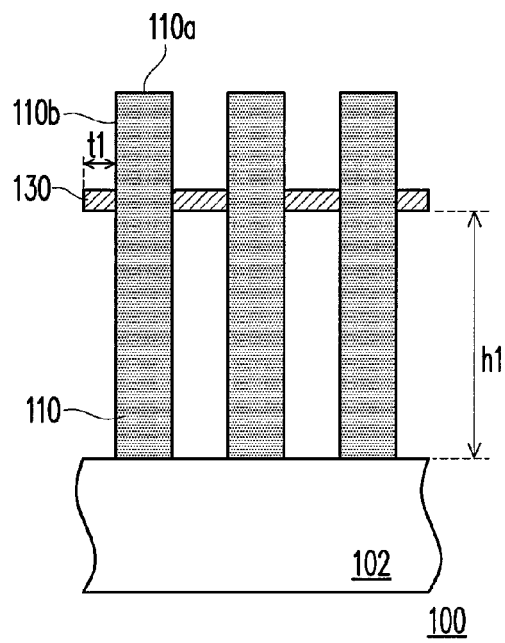
FIG. 4D-I
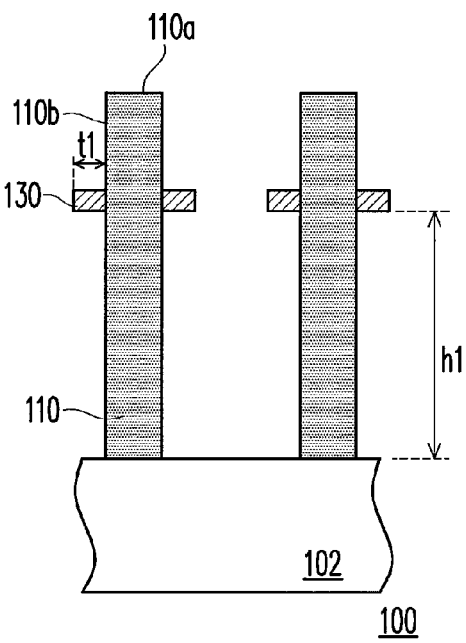
FIG. 4D-II

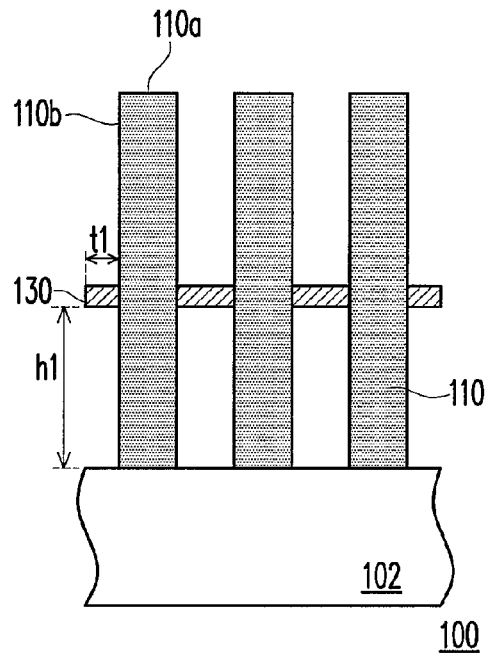
FIG. 6A-I
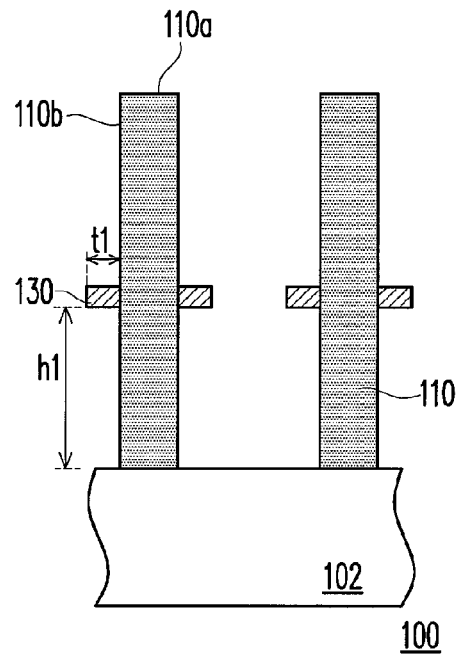
FIG. 6A-II
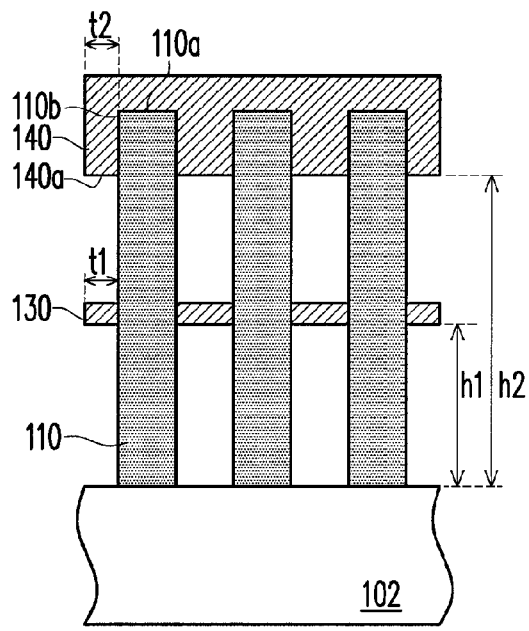
FIG. 6B-I
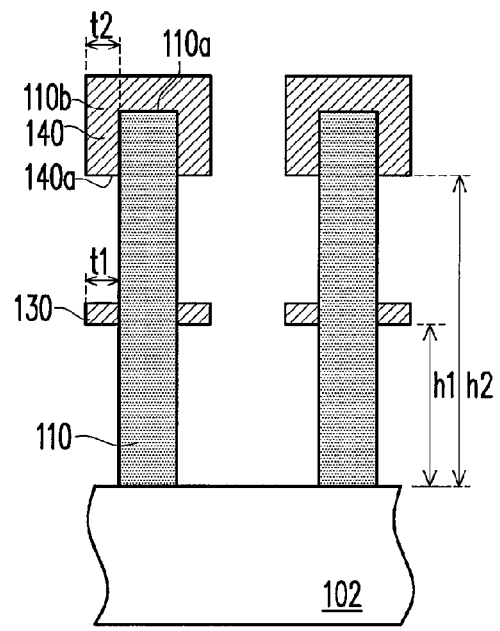
FIG. 6B-II

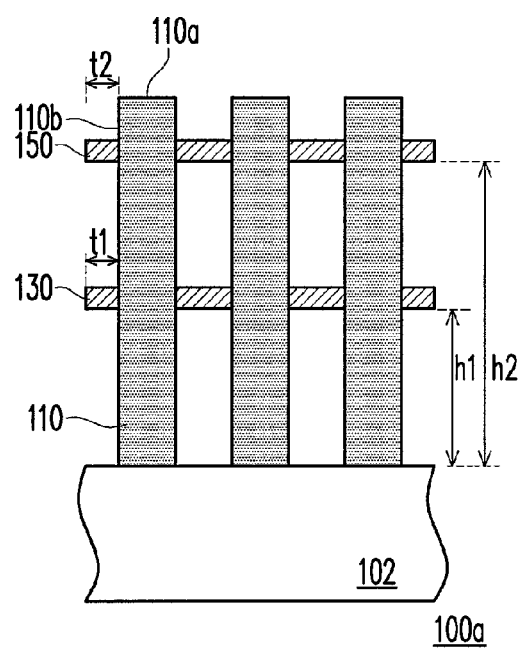
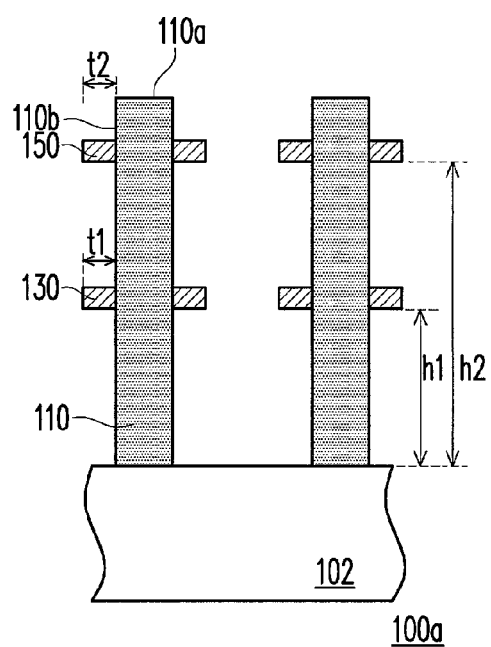
FIG. 6C-I  FIG. 6C-II

FABRICATING METHOD OF SEMICONDUCTOR DEVICE

BACKGROUND OF THE INVENTION

1. Field of the Invention

The invention relates to a semiconductor device and a fabricating method thereof. More particularly, the invention relates to a semiconductor device having supporting elements and a fabricating method of the semiconductor device.

2. Description of Related Art

With advancement of technologies, the level of integration of electronic devices tends to be raised, so as to comply with current demands for light weight and compactness. In order to improve the level of integration, not only dimensions of semiconductor devices can be reduced, but also the distance between semiconductor components can be decreased. Nevertheless, either the size reduction of the semiconductor devices or the decrease in the distance between the semiconductor components may result in certain manufacturing issues.

Fabrication of conductive wires, plugs, and capacitors is taken for example. As the dimensions of the semiconductor devices continue to decrease, the dimensions of conductive wires, plugs, and capacitors in the semiconductor devices are correspondingly reduced. Accordingly, an aspect ratio of the conductive wires, the plugs, and the capacitors becomes greater and greater, which gives rise to difficulties in manufacturing the conductive wires, the plugs, and the capacitors. In particular, if the aspect ratio of the components is excessively large, the components are likely to be distorted or collapsed due to insufficient support, and thus performance of the semiconductor devices is deteriorated.

SUMMARY OF THE INVENTION

The invention is directed to a semiconductor device and a fabricating method thereof, so as to ensure pillars are well-supported.

The invention provides a fabricating method of a semiconductor device. In the fabricating method, pillars are formed on a substrate. A first oxide layer is continuously formed on upper surfaces and side walls of the pillars by non-conformal liner atomic layer deposition (NOLA). The first oxide layer continuously covers the pillars and has at least one first opening. The first oxide layer is partially removed to expose the upper surfaces of the pillars and a first supporting element is formed on the side wall of each of the pillars. Besides, the first supporting element is located at a first height on the side wall of a corresponding one of the pillars and surrounds periphery of the corresponding pillar. Here, the first supporting elements around two of the pillars adjacent to each other are connected, and the first supporting elements around two of the pillars opposite to each other do not mutually come into contact and have a second opening therebetween.

In an embodiment of the invention, a material of the first oxide layer includes $Al_2O_3$.

In an embodiment of the invention, a material of the pillars includes polysilicon, tungsten, and titanium nitride.

In an embodiment of the invention, an aspect ratio of each of the pillars ranges from substantially 10 to 60.

In an embodiment of the invention, a method of forming the pillars includes forming a sacrificial layer on the substrate; forming a plurality of third openings in the sacrificial layer; forming the pillars in the third openings, and partially removing the sacrificial layer. As such, a height of the sacrificial layer is less than the first height.

In an embodiment of the invention, the fabricating method further includes removing the remaining sacrificial layer from the at least one first opening before partially removing the first oxide layer.

In an embodiment of the invention, the fabricating method further includes removing the remaining sacrificial layer from the second opening.

In an embodiment of the invention, a material of the sacrificial layer includes silicon and silicon oxide.

In an embodiment of the invention, a method of forming the pillars includes chemical vapor deposition (CVD).

In an embodiment of the invention, a shape of each of the pillars includes a cylindrical shape.

In an embodiment of the invention, a shape of each of the first supporting elements includes a hollow ring shape.

In an embodiment of the invention, the fabricating method further includes following steps. A second oxide layer is continuously formed on the upper surfaces and the side walls of the pillars by NOLA. The second oxide layer continuously covers the pillars and has at least one fourth opening. The second oxide layer is partially removed to expose the upper surfaces of the pillars, and a second supporting element is formed on the side wall of each of the pillars. Besides, the second supporting element is located at a second height on the side wall of a corresponding one of the pillars and surrounds the periphery of the corresponding pillar. The second supporting elements around two of the pillars adjacent to each other are connected, and the second supporting elements around two of the pillars opposite to each other do not mutually come into contact and have a fifth opening therebetween. The second height is greater than the first height.

In an embodiment of the invention, a material of the second oxide layer includes $Al_2O_3$.

In an embodiment of the invention, a shape of each of the second supporting elements includes a hollow ring shape.

The invention further provides a semiconductor device including a plurality of pillars, a plurality of first supporting elements, and a plurality of second supporting elements. The pillars are disposed on a substrate. Each of the first supporting elements is disposed at a first height on a side wall of each of the pillars and surrounds periphery of each of the pillars. Here, the first supporting elements around two of the pillars adjacent to each other are connected, and the first supporting elements around two of the pillars opposite to each other do not mutually come into contact. Each of the second supporting elements is disposed at a second height on the side wall of each of the pillars and surrounds the periphery of each of the pillars. Here, the second supporting elements around two of the pillars adjacent to each other are connected, and the second supporting elements around two of the pillars opposite to each other do not mutually come into contact. The first height is not equal to the second height.

In an embodiment of the invention, an aspect ratio of each of the pillars ranges from substantially 10 to 60.

In an embodiment of the invention, a material of the first supporting elements and a material of the second supporting elements include $Al_2O_3$.

In an embodiment of the invention, a material of the pillars includes polysilicon, tungsten, and titanium nitride.

In an embodiment of the invention, a shape of each of the pillars includes a cylindrical shape.

In an embodiment of the invention, a shape of each of the first supporting elements and a shape of each of the second supporting elements include a hollow ring shape.

Based on the above, the fabricating method of the semiconductor device includes forming the supporting elements on the side walls of the pillars by NOLA according to the invention. Here, the supporting elements can be located at any height on the side walls of the pillars, and the supporting elements at the same height are connected, such that the pillars are substantially connected. Thereby, the pillars can be firm, stable, and well-supported, and thus performance as well as yield of the semiconductor device can be improved.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A-I to FIG. 2C-I are schematic cross-sectional views taken along a line I-I' depicted in FIG. 1A to FIG. 1C. FIG. 2A-II to FIG. 2C-II are schematic cross-sectional views taken along a line II-II' depicted in FIG. 1A to FIG. 1C.

FIG. 4A-I to FIG. 4D-I are schematic cross-sectional views taken along a line I-I' depicted in FIG. 3A to FIG. 3D. FIG. 4A-II to FIG. 4D-II are schematic cross-sectional views taken along a line II-II' depicted in FIG. 3A to FIG. 3D.

FIG. 6A-I to FIG. 6C-I are schematic cross-sectional views taken along a line I-I' depicted in FIG. 5A to FIG. 5C. FIG. 6A-II to FIG. 6C-II are schematic cross-sectional views taken along a line II-II' depicted in FIG. 5A to FIG. 5C.

DESCRIPTION OF EMBODIMENTS

Figure 1A:
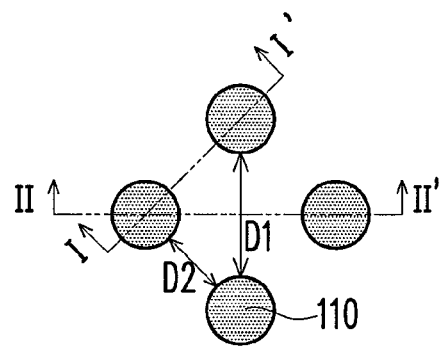
FIG. 1A to FIG. 1C are schematic top views illustrating a fabricating method of a semiconductor device according to a first embodiment of the invention.
Figure 1B:
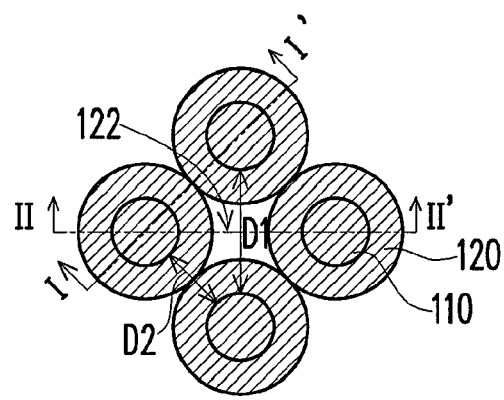
Figure 1C:
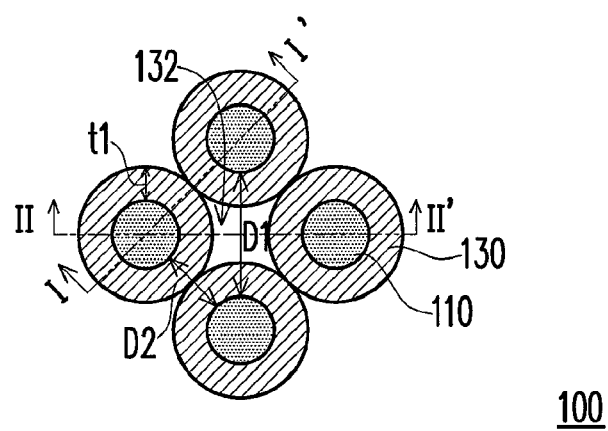

FIG. 1A to FIG. 1C are schematic top views illustrating a fabricating method of a semiconductor device according to a first embodiment of the invention. FIG. 2A-I to FIG. 2C-I are schematic cross-sectional views taken along a line I-I' depicted in FIG. 1A to FIG. 1C. FIG. 2A-II to FIG. 2C-II are schematic cross-sectional views taken along a line II-II' depicted in FIG. 1A to FIG. 1C. With reference to FIG. 1A, FIG. 2A-I, and FIG. 2A-II, pillars 110 are formed on a substrate 102. In this embodiment, the pillars 110 are formed by forming a material layer (not shown) on the substrate 102 and patterning the material layer to form the pillars 110 separated from one another, for example. Each of the pillars 110, for example, has a high aspect ratio ranging from substantially 10 to 60. In an embodiment of the invention, the material layer, for example, is a conductive layer or a non-conductive layer. The conductive layer is made of polysilicon, tungsten, or titanium nitride, for example. The non-conductive layer is made of silicon oxide, for example. Here, the polysilicon is exemplarily formed by low pressure chemical vapor deposition (LPCVD), and the tungsten or the titanium nitride is exemplarily formed by CVD. Certainly, the material layer can also be made of other materials and formed by other ways, which should not be construed as limitations to this invention.

In other words, the pillars 110 can be made of the conductive materials (e.g. polysilicon, tungsten, titanium nitride, and so on) or the non-conductive materials (e.g. silicon oxide). In this embodiment, as shown in FIG. 1A, a distance between two opposite pillars 110 is D1, and a distance between two adjacent pillars 110 is D2, for instance. Here, the distance D1 is greater than the distance D2. Note that the pillars 110 are cylinders, and four of the pillars 110 as shown in the drawings are adjacent to each other in this embodiment. Besides, two of the four pillars 110 are opposite to each other, and the other two of the four pillars 110 are opposite to each other in this embodiment. However, in other embodiments of the invention, the pillars 110 can also have other shapes and configurations, which should not be construed as limitations to this invention. Moreover, as shown in the drawings, the pillars 110 are directly disposed on the substrate 102, for example. Nevertheless, the pillars 110 can also be disposed on another material layer (e.g. a dielectric layer) on the substrate 102, i.e. the pillars 110 do not directly come into contact with the substrate 102.

With reference to FIG. 1B, FIG. 2B-I, and FIG. 2B-II, a first oxide layer 120 is continuously formed on upper surfaces 110a and side walls 110b of the pillars 110 by NOLA. The first oxide layer 120 continuously covers the pillars 110 and has at least one first opening 122. In this embodiment, a material of the first oxide layer 120 is $Al_2O_3$, for instance. The first oxide layer 120 located on the side wall 110b of each of the pillars 110 has a width t1, for instance. Besides, a bottom 120a of the first oxide layer 120 is located at a height h1 on the side wall 110b of each of the pillars 110, for instance. In this embodiment, pulse time in the NOLA process can be adjusted to control the width t1 of the first oxide layer 120 on the side wall 110b of each of the pillars 110 and the extended location of the first oxide layer 120 on the side wall 110b of each of the pillars 110 (i.e. the height h1). For instance, the width t1 of the first oxide layer 120 on the side wall 110b of each of the pillars 110 is greater than half of the distance D2 between two adjacent pillars 110, and the width t1 of the first oxide layer 120 on the side wall 110b of each of the pillars 110 is less than half of the distance D1 between two opposite pillars 110, such that the first oxide layer 120 has at least one first opening 122 exposing the substrate 102.

With reference to FIG. 1C, FIG. 2C-I, and FIG. 2C-II, the first oxide layer 120 is partially removed to expose the upper surfaces 110a of the pillars 110, and a first supporting element 130 is formed on the side wall 110b of each of the pillars 110, so as to completely form the semiconductor device 100. The first supporting element 130 is located at a height h1 on the side wall 110b of the corresponding pillar 110 and surrounds the periphery of the corresponding pillar 110. Here, the first supporting elements 130 around two adjacent pillars 110 are connected, and the first supporting elements 130 around two opposite pillars 110 do not mutually come into contact and have a second opening 132 therebetween. In this embodiment, the first oxide layer 120 is partially removed by dry etching or wet etching, for instance. It can be learned from FIG. 1C that the first supporting elements 130 have a hollow ring shape, for example. The width t1 of each of the first supporting elements 130, for example, is greater than half of the distance D2 between two adjacent pillars 110, such that the first supporting elements 130 around the two adjacent pillars 110 are connected. In addition, the width t1 of each of the first supporting elements 130, for example, is less than half of the distance D1 between two opposite pillars 110, such that the first supporting elements 130 around the two opposite pillars 110 do not mutually come into contact and have the second opening 132 therebetween. Here, the second opening 132 is substantially equal to the first opening 122 of the first oxide layer 120. That is to say, each of the first supporting elements 130 surrounds one of the pillars 110, respectively, and the first supporting elements 130 are substantially connected. Thereby, the pillars 110 are substantially connected together, and thus the first supporting elements 130 can well support the pillars 110. As such, the pillars 110 are firm, stable, and are neither distorted nor collapsed.

In this embodiment, the fabricating method of the semiconductor device 100 includes forming the first supporting elements 130 on the side walls 110b of the pillars 110 by NOLA. The first supporting elements 130 can be located at any height on the side walls 110b of the pillars 110, and the first supporting elements 130 at the same height are substantially connected together. As such, the first supporting elements 130 can well support the pillars 110, and accordingly the pillars 110 are firm and stable. More particularly, distortion or collapse of the first supporting elements 130 with the high aspect ratio can be prevented. In other words, the pillars 110 can be firm, stable, and well-supported, and thereby performance as well as yield of the semiconductor device 100 can be improved.

FIG. 3A to FIG. 3D are schematic top views illustrating a fabricating method of a semiconductor device according to a second embodiment of the invention. FIG. 4A-I to FIG. 4D-I are schematic cross-sectional views taken along a line I-I' depicted in FIG. 3A to FIG. 3D. FIG. 4A-II to FIG. 4D-II are schematic cross-sectional views taken along a line II-II' depicted in FIG. 3A to FIG. 3D. With reference to FIG. 3A, FIG. 4A-I, and FIG. 4A-II, pillars 110 are formed on a substrate 102. In a method of forming the pillars 110 according to this embodiment, for example, a sacrificial layer 104 is formed on the substrate 102, and openings 106 are formed in the sacrificial layer 104. Each of the pillars 110 is then formed in one of the openings 106, and the sacrificial layer 104 is partially removed, such that the sacrificial layer 104 has a height H. To form the pillars 110, a material layer (not shown) can be formed on the sacrificial layer 104. The material layer, for example, covers the sacrificial layer 104, and the openings 106 are filled with the material layer. The material layer that does not fill the openings 106 is removed, so as to form one pillar 110 in each of the openings 106. In this embodiment, each of the pillars 110, for example, has a high aspect ratio ranging from substantially 10 to 60. There is a relatively large etching selectivity ratio between a material of the sacrificial layer 104 and a material of the pillars 110, and the sacrificial layer 104 is frequently made of an insulating material. For instance, the sacrificial layer 104 is made of silicon or silicon oxide, and the pillars 110 are made of polysilicon, tungsten, titanium nitride, or other conductive materials. Besides, the sacrificial layer 104 can be formed by CVD, and the pillars 110 can be formed by LPCVD or CVD, for instance. The sacrificial layer 104 can be removed by dry etching or wet etching, for instance.

Figure 3A:
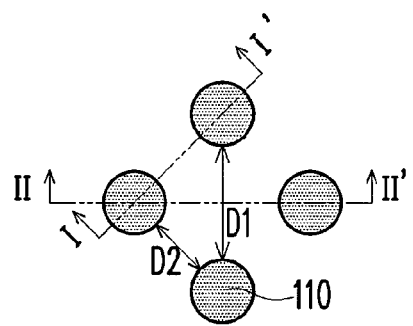
FIG. 3A to FIG. 3D are schematic top views illustrating a fabricating method of a semiconductor device according to a second embodiment of the invention.
Figure 3B:
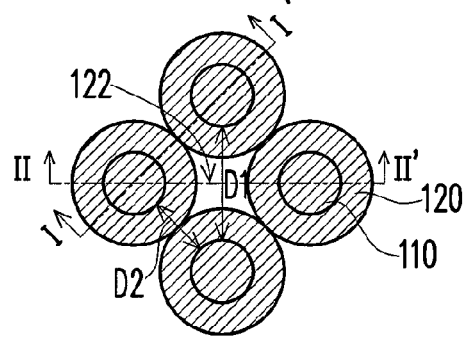
Figure 3C:
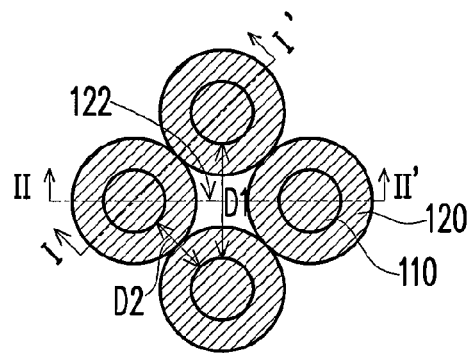
Figure 3D:
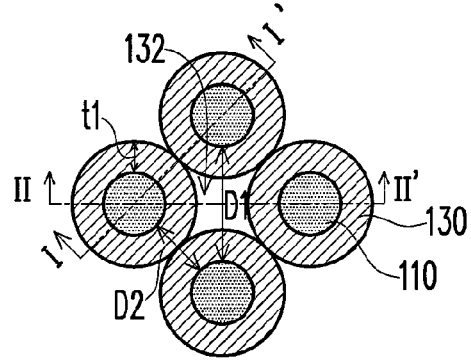

In this embodiment, as shown in FIG. 3A, a distance between two opposite pillars 110 is D1, and a distance between two adjacent pillars 110 is D2, for instance. Here, the distance D1 is greater than the distance D2. Note that the pillars 110 are cylinders, and four of the pillars 110 as shown in the drawings are adjacent to each other in this embodiment. Besides, two the four pillars 110 are opposite to each other, and the other two of the four pillars 110 are opposite to each other in this embodiment. However, in other embodiments of the invention, the pillars 110 can also have other shapes and configurations, which should not be construed as limitations to this invention.

With reference to FIG. 3B, FIG. 4B-I, and FIG. 4B-II, a first oxide layer 120 is continuously formed on upper surfaces 110a and side walls 110b of the pillars 110 by NOLA. The first oxide layer 120 continuously covers the pillars 110 and has at least one first opening 122. In this embodiment, a material of the first oxide layer 120 is $Al_2O_3$, for instance. The first oxide layer 120 located on the side wall 110b of each of the pillars 110 has a width t1, for instance. Besides, a bottom 120a of the first oxide layer 120 is located at a height h1 on the side wall 110b of each of the pillars 110, for instance. In this embodiment, pulse time in the NOLA process can be adjusted to control the width t1 of the first oxide layer 120 on the side wall 110b of each of the pillars 110 and the extended location of the first oxide layer 120 on the side wall 110b of each of the pillars 110 (i.e. the height h1). For instance, the width t1 of the first oxide layer 120 on the side wall 110b of each of the pillars 110 is greater than half of the distance D2 between two adjacent pillars 110, and the width t1 of the first oxide layer 120 on the side wall 110b of each of the pillars 110 is less than half of the distance D1 between two opposite pillars 110, such that the first oxide layer 120 has at least one first opening 122 exposing the substrate 102.

As indicated in FIG. 3C, FIG. 4C-I, and FIG. 4C-II, the remaining sacrificial layer 104 is removed from the first opening 122. In this embodiment, the sacrificial layer 104 is removed by dry etching or wet etching, for instance. Note that the first oxide layer 120 is continuously formed on the upper surfaces 110a and the side walls 110b of the pillars 110, so as to connect the pillars 110 together. Therefore, after the sacrificial layer 104 is removed, the pillars 110 can still be supported by the first oxide layer 120, and distortion or collapse of the pillars 110 can be prevented.

With reference to FIG. 3D, FIG. 4D-I, and FIG. 4D-II, the first oxide layer 120 is partially removed to expose the upper surfaces 110a of the pillars 110, and a first supporting element 130 is formed on the side wall 110b of each of the pillars 110, so as to completely form the semiconductor device 100. The first supporting element 130 is located at a height h1 on the side wall 110b of the corresponding pillar 110 and surrounds the periphery of the corresponding pillar 110. Here, the first supporting elements 130 around two adjacent pillars 110 are connected, and the first supporting elements 130 around two opposite pillars 110 do not mutually come into contact and have a second opening 132 therebetween. In this embodiment, the first oxide layer 120 is partially removed by dry etching or wet etching, for instance. It can be learned from FIG. 3D that the first supporting elements 130 have a hollow ring shape, for example. The width t1 of each of the first supporting elements 130, for example, is greater than half of the distance D2 between two adjacent pillars 110, such that the first supporting elements 130 around the two adjacent pillars 110 are connected. In addition, the width t1 of each of the first supporting elements 130, for example, is less than half of the distance D1 between two opposite pillars 110, such that the first supporting elements 130 around the two opposite pillars 110 do not mutually come into contact and have the second opening 132 therebetween. Here, the second opening 132 is substantially equal to the first opening 122 of the first oxide layer 120. Namely, each of the first supporting elements 130 surrounds one of the pillars 110, and the first supporting elements 130 are substantially connected together, such that the pillars 110 are substantially connected together. Thereby, the first supporting elements 130 can well support the pillars 110. As such, the pillars 110 are firm, stable, and are neither distorted nor collapsed.

Note that in this embodiment the remaining sacrificial layer 104 is removed from the first opening 122 before the first supporting elements 130 are formed. However, in another embodiment (not shown), it is possible to form the first supporting elements 130 and then remove the remaining sacrificial layer 104 from the second opening 132 between the first supporting elements 130.

In this embodiment, the fabricating method of the semiconductor device 100 includes forming the pillars 110 in the openings 106 of the sacrificial layer 104 and forming the first supporting elements 130 on the side walls 110b of the pillars 110 by NOLA. The first supporting elements 130 can be located at any height on the side walls 110b of the pillars 110, and the first supporting elements 130 at the same height are substantially connected together. Hence, before the first supporting elements 130 are formed, the sacrificial layer 104 can well support the pillars 110 to prevent distortion or collapse of the pillars 110. After the sacrificial layer 104 is removed, the first supporting elements 130 can well support the pillars 110, such that the pillars 110 are firm and stable. In other words, the sacrificial layer 104 ensures the pillars 110 to have the firm, stable structures, and thus this embodiment is particularly applicable to the first supporting elements 130 having the high aspect ratio, so as to prevent distortion or collapse of the pillars 110. As such, the pillars 110 can be firm, stable, and well-supported, and thus performance as well as yield of the semiconductor device 100 can be improved.

Figure 5A:
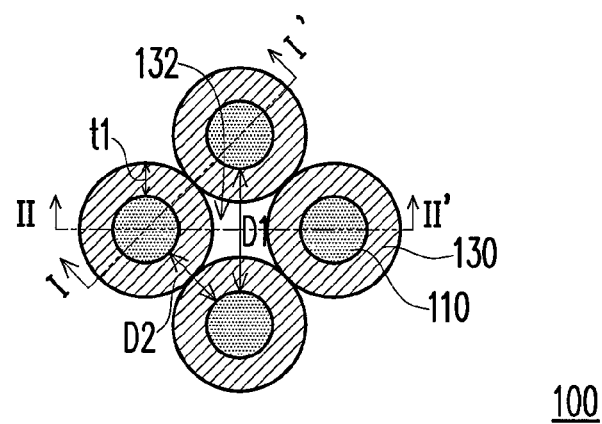
FIG. 5A to FIG. 5C are schematic top views illustrating a fabricating method of a semiconductor device according to a third embodiment of the invention.
Figure 5B:
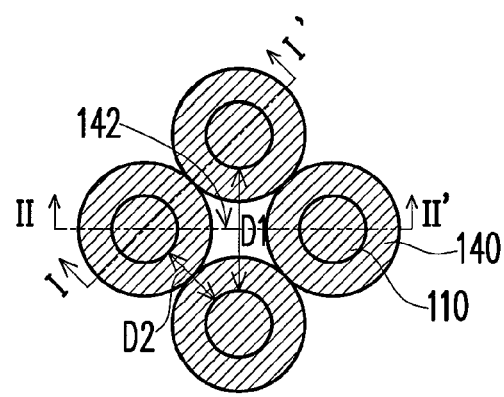
Figure 5C:
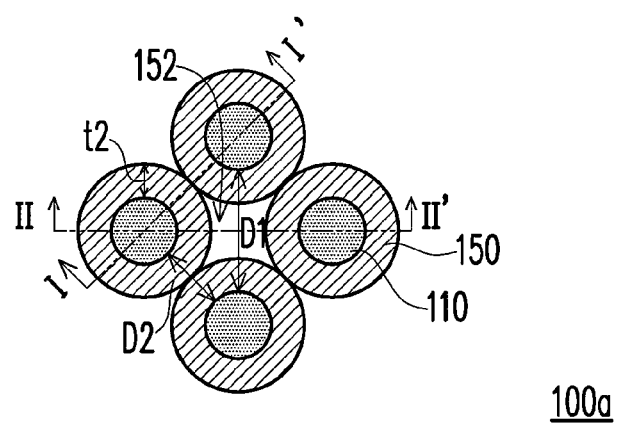

In the previous embodiment, each of the first supporting elements 130 is formed on the side wall 110b of one of the pillars 110, respectively. To further strengthen the structures of the pillars 110, it is also likely to form a plurality of supporting elements at different heights on the side wall 110b of one of the pillars 110. FIG. 5A to FIG. 5C are schematic top views illustrating a fabricating method of a semiconductor device according to a third embodiment of the invention. FIG. 6A-I to FIG. 6C-I are schematic cross-sectional views taken along a line I-I' depicted in FIG. 5A to FIG. 5C. FIG. 6A-II to FIG. 6C-II are schematic cross-sectional views taken along a line II-II' depicted in FIG. 5A to FIG. 5C. With reference to FIG. 5A, FIG. 6A-I, and FIG. 6A-II, a semiconductor device 100 is provided. The semiconductor device 100 includes a substrate 102, a plurality of pillars 110 formed on the substrate 102, and a plurality of first supporting elements 130. Each of the first supporting elements 130 is disposed at a height h1 on a side wall 110b of each of the pillars 110 and surrounds the periphery of each of the pillars 110. Here, the first supporting elements 130 around two adjacent pillars 110 are connected, and the first supporting elements 130 around two opposite pillars 110 do not mutually come into contact. The semiconductor device 100 of this embodiment has the same structure and the same fabricating method as those described in the first embodiment and the second embodiment, for example, and therefore no further description is provided herein.

With reference to FIG. 5B, FIG. 6B-I, and FIG. 6B-II, a second oxide layer 140 is continuously formed on the upper surfaces 110a and the side walls 110b of the pillars 110 by NOLA. The second oxide layer 140 continuously covers the pillars 110 and has at least one fourth opening 142. In this embodiment, a material of the second oxide layer 140 is $Al_2O_3$, for instance. The second oxide layer 140 located on the side wall 110b of each of the pillars 110 has a width t2, for instance. Besides, a bottom 140a of the second oxide layer 140 is located at a height h2 on the side wall 110b of each of the pillars 110, for instance. The height h2 is greater than the height h1. In this embodiment, pulse time in the NOLA process can be adjusted to control the width t2 of the second oxide layer 140 on the side wall 110b of each of the pillars 110 and the extended location of the second oxide layer 140 on the side wall 110b of each of the pillars 110 (i.e. the height h2). For instance, the width t2 of the second oxide layer 140 on the side wall 110b of each of the pillars 110 is greater than half of the distance D2 between two adjacent pillars 110, and the width t2 of the second oxide layer 140 on the side wall 110b of each of the pillars 110 is less than half of the distance D1 between two opposite pillars 110, such that the second oxide layer 140 has at least one fourth opening 142 exposing the substrate 102.

With reference to FIG. 5C, FIG. 6C-I, and FIG. 6C-II, the second oxide layer 140 is partially removed to expose the upper surfaces 110a of the pillars 110, and a second supporting element 150 is formed on the side wall 110b of each of the pillars 110, so as to completely form the semiconductor device 100a. The second supporting element 150 is located at a height h2 on the side wall 110b of the corresponding pillar 110 and surrounds the periphery of the corresponding pillar 110. Here, the second supporting elements 150 around two adjacent pillars 110 are connected, and the second supporting elements 150 around two opposite pillars 110 do not mutually come into contact and have a fifth opening 152 therebetween. In this embodiment, the second oxide layer 140 is partially removed by dry etching or wet etching, for instance. It can be learned from FIG. 5C that the second supporting elements 150 have a hollow ring shape, for example. The width t2 of each of the second supporting elements 150, for example, is greater than half of the distance D2 between two adjacent pillars 110, such that the second supporting elements 150 around the two adjacent pillars 110 are connected. In addition, the width t2 of each of the second supporting elements 150, for example, is less than half of the distance D1 between two opposite pillars 110, such that the second supporting elements 150 around the two opposite pillars 110 do not mutually contact and have the fifth opening 152 therebetween. Here, the fifth opening 152 is substantially equal to the fourth opening 142 of the second oxide layer 140. Namely, each of the second supporting elements 150 surrounds one of the pillars 110, and the second supporting elements 150 are substantially connected together, such that the pillars 110 are substantially connected together. Thereby, the second supporting elements 150 can well support the pillars 110. As such, the pillars 110 are firm, stable, and are neither distorted nor collapsed.

In this embodiment, the fabricating method of the semiconductor device 100a includes sequentially forming the first supporting element 130 and the second supporting element 150 on the side wall 110b of each of the pillars 110 through NOLA. Pulse time and other parameters in the NOLA process can be adjusted to control the extended height of the oxide layers 120 and 140 on the side walls of the pillars 110, and therefore the first supporting elements 130 and the second supporting elements 150 can be formed respectively at the height h1 and the height h2 on the side walls 110b of the pillars 110. Namely, by NOLA, the oxide layers can be formed at any height on the side walls of the pillars, such that the supporting element can be formed at any height on the side wall of each of the pillars. Further, a plurality of supporting elements can be formed at any height on the side walls of the pillars. According to this embodiment, the pillars are surrounded by the supporting elements at different heights, and the supporting elements at the same height are connected, such that the pillars are substantially connected. Hence, the supporting elements well support the pillars, so as to ensure the pillars to have the first, stable structures. More particularly, distortion or collapse of the supporting elements with the high aspect ratio can be prevented. In other words, the pillars can be firm, stable, and well-supported, and thereby performance as well as yield of the semiconductor device can be improved.

In general, with the rising level of integration and increasing complexity of the electronic devices, the aspect ratio of the semiconductor devices is increasing. As such, the semiconductor devices are likely to be distorted or collapsed due to insufficient support, and thus performance of the semiconductor devices is deteriorated. However, the fabricating method of the semiconductor device described in the previous embodiments can be applied to ensure that the pillars having the high aspect ratio are well-supported, and that performance as well as yield of the semiconductor device can be enhanced. For instance, the fabricating methods of the semiconductor device described in the previous embodiments are applicable to fabrication of conductive wires, plugs, capacitors, and other components. Specifically, as a dielectric material layer tends to have a low dielectric coefficient, it is likely for the plugs not to be surrounded by the dielectric layer, and such plugs can be made by applying the fabricating method of the semiconductor device of this invention.

Figures 7A, 7B:
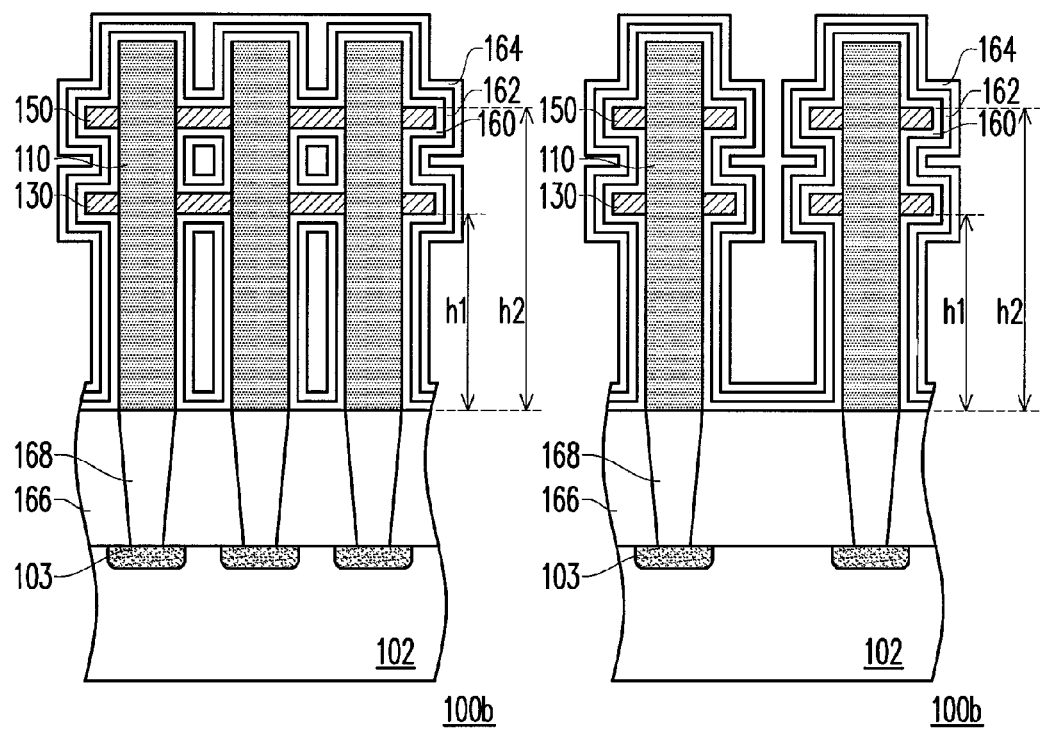
FIG. 7A and FIG. 7B are schematic cross-sectional views illustrating a semiconductor device according to an embodiment of the invention.

FIG. 7A and FIG. 7B are schematic cross-sectional views illustrating a semiconductor device according to an embodiment of the invention. As indicated in FIG. 7A and FIG. 7B, a semiconductor device 100b of this embodiment is a capacitor, for example. The semiconductor device 100b includes a plurality of pillars 110, a plurality of supporting elements 130 and 150, a capacitor dielectric layer 160, an upper electrode 162, an upper electrode connecting part 164, and a lower electrode connecting part 168. The pillars 110 are disposed on an interlayer dielectric 166. Besides, the pillars 110 serving as the lower electrode in the capacitor are made of titanium nitride, ruthenium, or other materials, for instance. The interlayer dielectric 166 is formed on the substrate 102, and doped regions 103 coming into contact with the lower electrode connecting part 168 are located in the substrate 102 in most cases. The supporting elements 130 and 150 are disposed at a first height h1 and a second height h2 on the pillars 110, so as to well support the pillars 110. The pillars 110 and the supporting elements 130 and 150 can be formed in the same manner as described above, and therefore no further description is provided herein. The capacitor dielectric layer 160 is formed between the upper electrode 162 and the pillars 110 serving as the lower electrode. The upper electrode connecting part 164 is formed on the upper electrode 162 to connect the upper electrode 162, and the lower electrode connecting part 168 is formed in the interlayer dielectric 166 to connect the pillars 110 serving as the lower electrode. Even through the pillar-like lower electrode (i.e. the pillars 110) in the capacitor has the high aspect ratio, the pillar-like lower electrode can still be firm and stable because the capacitor includes the supporting elements 130 and 150 which can well support the pillar-like lower electrode (i.e. the pillars 110). Thereby, the capacitor can have favorable performance and yield. It should be mentioned the capacitor depicted in FIG. 7A and FIG. 7B is taken to exemplify the invention as provided in this embodiment; however, the fabricating method of the semiconductor device in this invention can also be applied to the capacitors having other structures, which should not be construed as a limitation to this invention. Moreover, in addition to the afore-mentioned conductive wires, the plugs, and the capacitors, the fabricating method of the semiconductor device in this invention can also be applied to the other structures having the high aspect ratio, which is not limited in this invention.

In light of the foregoing, the fabricating method of the semiconductor device includes forming the supporting elements on the side walls of the pillars by NOLA according to the invention. Here, the supporting elements can be located at any height on the side walls of the pillars, and the supporting elements at the same height are connected, such that the pillars are substantially connected together. As such, the supporting elements can well support the pillars, and accordingly the pillars are firm and stable. More particularly, distortion or collapse of the supporting elements with the high aspect ratio can be prevented. Besides, the supporting elements can be sequentially formed at different heights on the pillars by NOLA, so as to well support the pillars. Thereby, the pillars can be firm, stable, and well-supported, and thus performance as well as yield of the semiconductor device can be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A fabricating method of a semiconductor device comprising:
   forming a plurality of pillars on a substrate;
   continuously forming a first oxide layer on upper surfaces and side walls of the pillars by non-conformal liner atomic layer deposition, the first oxide layer continuously covering the pillars and having at least one first opening; and
   partially removing the first oxide layer to expose the upper surfaces of the pillars and therefore forming a first supporting element on the side wall of each of the pillars from the first oxide layer, the first supporting element being located at a first height on the side wall of a corresponding one of the pillars and surrounding periphery of the corresponding pillar, wherein the first supporting elements around two of the pillars adjacent to each other are connected, and the first supporting elements around two of the pillars opposite to each other do not mutually come into contact and have a second opening therebetween.

2. The fabricating method as claimed in claim 1, wherein a material of the first oxide layer comprises $Al_2O_3$.

3. The fabricating method as claimed in claim 1, wherein a material of the pillars comprises polysilicon, tungsten, and titanium nitride.

4. The fabricating method as claimed in claim 1, wherein an aspect ratio of each of the pillars ranges from substantially 10 to 60.

5. The fabricating method as claimed in claim 1, wherein a method of forming the pillars comprises:
   forming a sacrificial layer on the substrate;
   forming a plurality of third openings in the sacrificial layer;
   forming the pillars in the third openings; and
   partially removing the sacrificial layer, such that a height of the sacrificial layer is less than the first height.

6. The fabricating method as claimed in claim 5, further comprising removing the remaining sacrificial layer from the at least one first opening before partially removing the first oxide layer.

7. The fabricating method as claimed in claim 5, further comprising removing the remaining sacrificial layer from the second opening.

8. The fabricating method as claimed in claim 5, wherein a material of the sacrificial layer comprises silicon and silicon oxide.

9. The fabricating method as claimed in claim 1, wherein a method of forming the pillars comprises chemical vapor deposition.

10. The fabricating method as claimed in claim 1, wherein a shape of each of the pillars comprises a cylindrical shape.

11. The fabricating method as claimed in claim 1, wherein a shape of each of the first supporting elements comprises a hollow ring shape.

12. The fabricating method as claimed in claim 1, further comprising:
   continuously forming a second oxide layer on the upper surfaces and the side walls of the pillars by non-conformal liner atomic layer deposition, the second oxide layer continuously covering the pillars and having at least one fourth opening; and
   partially removing the second oxide layer to expose the upper surfaces of the pillars and forming a second supporting element on the side wall of each of the pillars, the second supporting element being located at a second height on the side wall of a corresponding one of the pillars and surrounding the periphery of the corresponding pillar, wherein the second supporting elements around two of the pillars adjacent to each other are connected, the second supporting elements around two of the pillars opposite to each other do not mutually come into contact and have a fifth opening therebetween, and the second height is greater than the first height.

13. The fabricating method as claimed in claim 12, wherein a material of the second oxide layer comprises $Al_2O_3$.

14. The fabricating method as claimed in claim 12, wherein a shape of each of the second supporting elements comprises a hollow ring shape.

* * * * *